United States Patent [19]

Morizuka

[11] Patent Number: 5,124,270
[45] Date of Patent: Jun. 23, 1992

[54] BIPOLAR TRANSISTOR HAVING EXTERNAL BASE REGION

[75] Inventor: Kouhei Morizuka, Yokohama, Japan

[73] Assignee: Kabushiki Kaisha Toshiba, Kawasaki, Japan

[21] Appl. No.: 584,443

[22] Filed: Sep. 17, 1990

Related U.S. Application Data

[62] Division of Ser. No. 244,268, Sep. 15, 1988, abandoned.

[30] Foreign Application Priority Data

Sep. 18, 1987 [JP] Japan ............................ 62-232288

[51] Int. Cl.$^5$ .................... H01L 21/265; H01L 29/70
[52] U.S. Cl. ........................... 437/31; 148/DIG. 11; 148/DIG. 72; 357/34
[58] Field of Search ................... 357/71, 34; 437/31

[56] References Cited

U.S. PATENT DOCUMENTS

| 4,599,791 | 7/1986 | Focht et al. | 437/24 |
| 4,679,305 | 7/1987 | Morizuka | 357/34 |
| 4,739,379 | 4/1988 | Akagi et al. | 357/34 |
| 4,889,831 | 12/1989 | Ishii et al. | 437/31 |
| 4,914,049 | 4/1990 | Huang et al. | 437/31 |

FOREIGN PATENT DOCUMENTS

| 61-131480 | 6/1986 | Japan | 357/71 |
| 61-187364 | 8/1986 | Japan | 357/71 |
| 61-256766 | 11/1986 | Japan | 357/71 |
| 62-49661 | 3/1987 | Japan | 357/34 |
| 0240307 | 10/1987 | Japan | 357/34 |

OTHER PUBLICATIONS

W. P. Dumke et al.: "GaAs-GaAlAs Hetrojunction Transistor for High Frequency Operation" Solid-State Electronics, 1972, vol. 15 pp. 1339-1343.

M. Suzuki et al.: "Refractory T Gate Self-Aligned GaAs FET (1)" p. 644 Extended Abstracts (The 32nd Spring Meeting, 1985); The Japan Society of Applied Physics and Related Societies.

Primary Examiner—Robert Kunemund
Assistant Examiner—Long Pham
Attorney, Agent, or Firm—Oblon, Spivak, McClelland, Maier & Neustadt

[57] ABSTRACT

A bipolar transistor is provided with an external base region. The bipolar transistor comprises a first semiconductor layer of a first conductivity type, the first semiconductor layer serving as a collector region, a second semiconductor layer of a second conductivity type, which is formed on the first semiconductor layer and includes a base region and an external base region located around the base region, a third semiconductor layer of the first conductivity type, which is formed on the second semiconductor layer and serves as an emitter region, a metal layer formed on the third semiconductor layer and serving as an emitter electrode, the metal layer including a first metal layer portion which is substantially as wide as the base region located in an intrinsic transistor region, and a second metal layer portion which is formed on the first metal layer portion and is wider than the first metal portion, a base electrode located on the external base region of the second semiconductor layer, and a collector electrode connected to the first semiconductor layer.

3 Claims, 6 Drawing Sheets

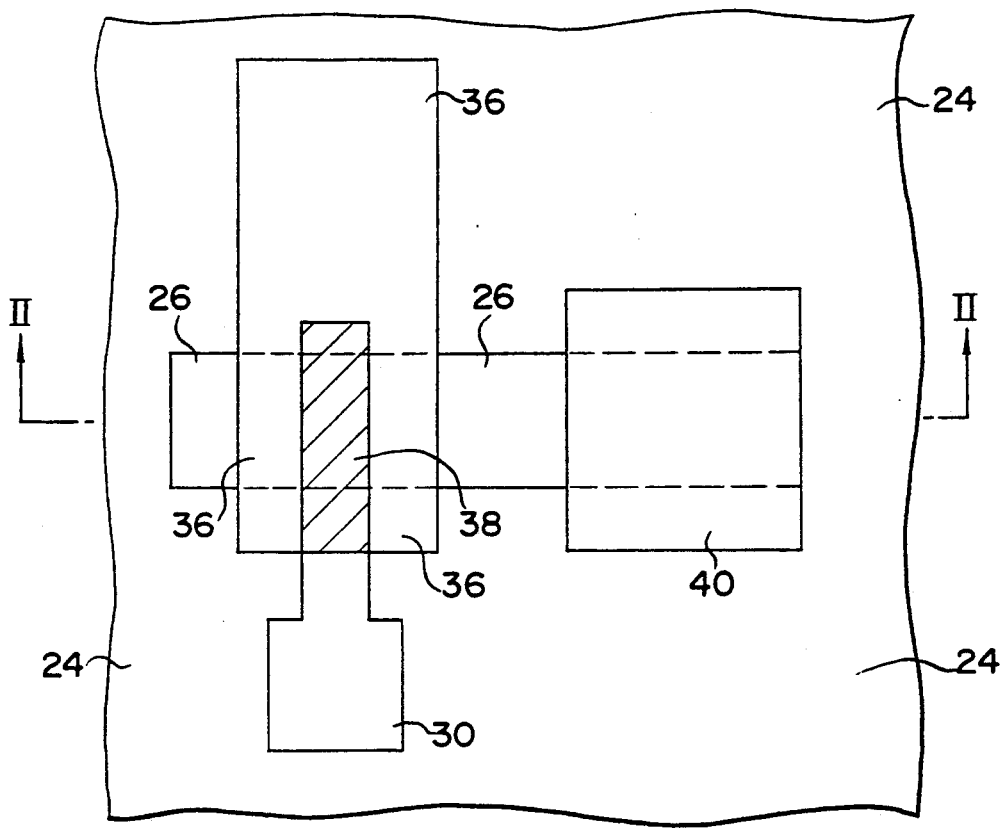
F I G. 1
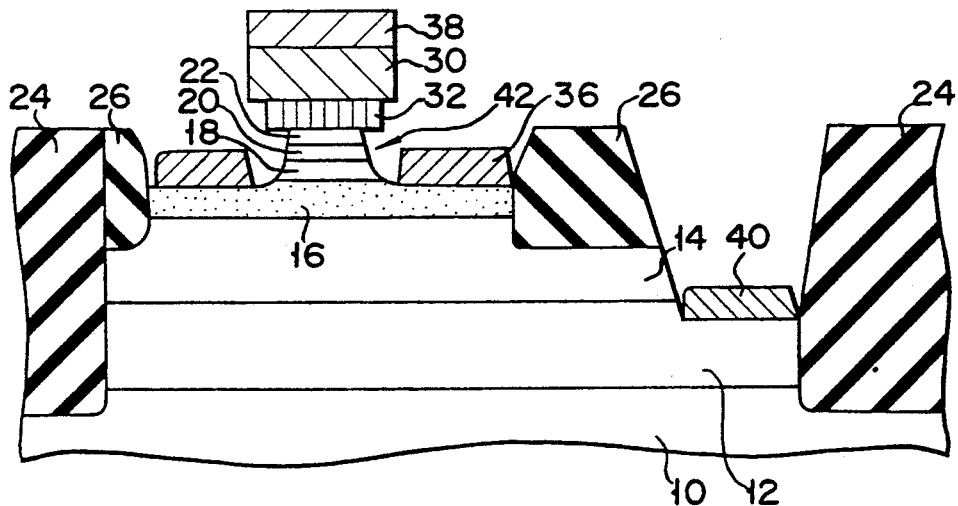
F I G. 2

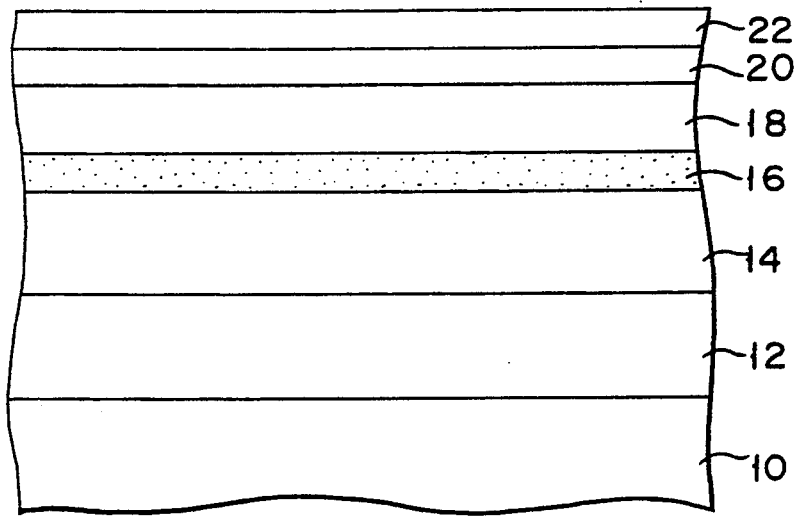
F I G. 3A
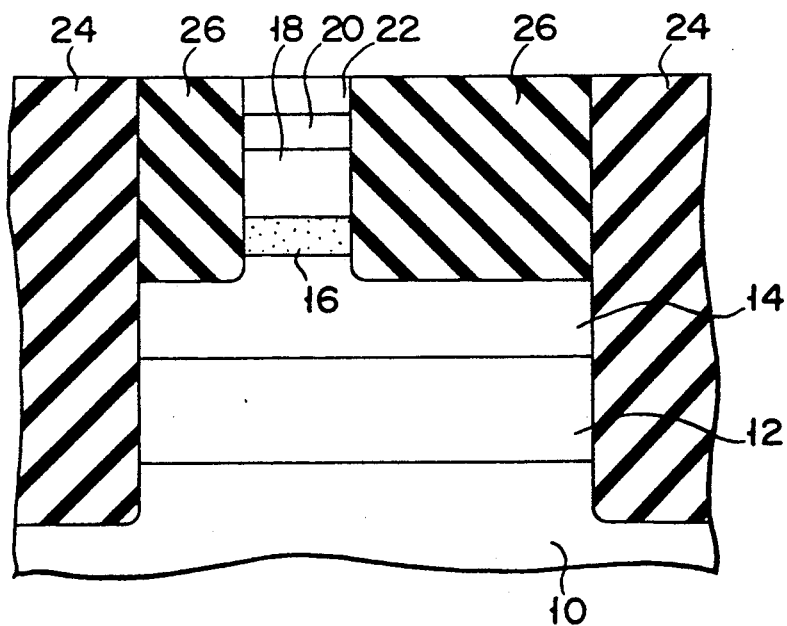
F I G. 3B

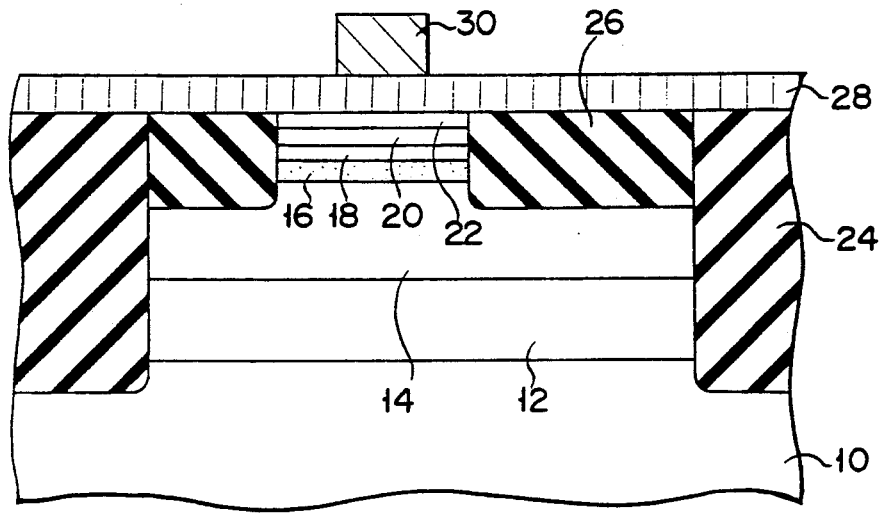
F I G. 3C
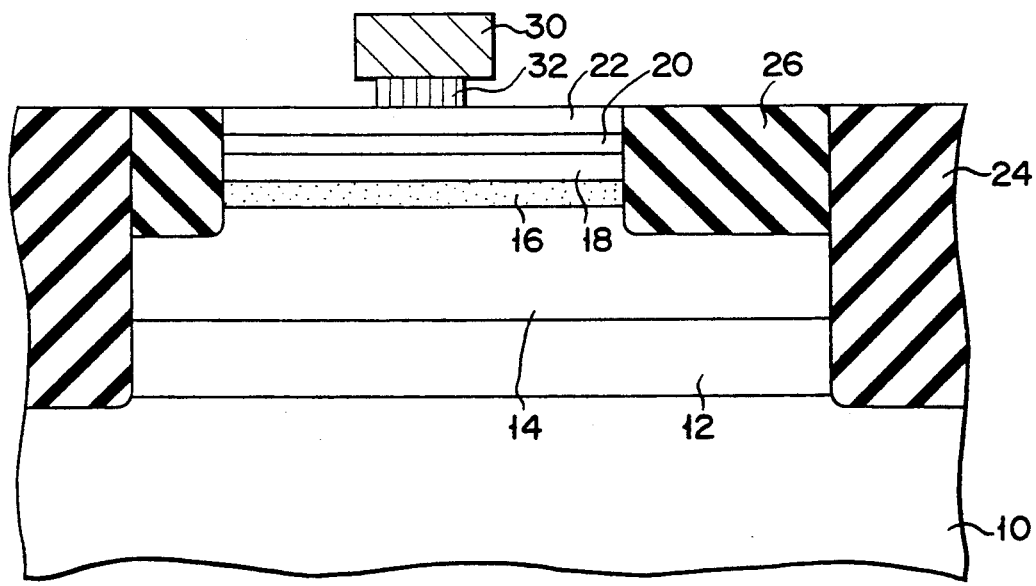
F I G. 3D

BIPOLAR TRANSISTOR HAVING EXTERNAL BASE REGION

This application is a division of application Ser. No. 07/244,268, filed on Sep. 15, 1988, now abandoned.

BACKGROUND OF THE INVENTION

1. Field of the Invention

The present invention relates to a semiconductor device and a manufacturing method therefor, and more particularly to a bipolar transistor type semiconductor device and a manufacturing method therefor.

2. Description of the Related Art

In comparison with a field-effect transistor, a bipolar transistor has a large current-driving power and a high cut-off frequency, so that it is suitable for use in a high-speed electric circuit. In order to drive a bipolar transistor at high speed, parasitic resistance and parasitic capacity must be reduced as small as possible. Effective measures taken for this, purpose are: (1) to reduce the base resistance by narrowing the emitter; and (2) to reduce the base-collector capacity by narrowing the base-collector region. In consideration of these measures, various self-alignment techniques have been developed with respect to Si-based, double-diffusion type transistors, particularly to double-diffusion type transistors wherein the emitter and base electrodes are formed of polycrystalline silicon. As a result of the self-alignment techniques, the constructions of transistors have been improved, and accordingly, semiconductor devices have come to achieve higher operation than before. At the present time, however, the techniques for achieving higher operation of semiconductors seem to have reached their limits.

In recent years, attention of those engaged in the art is attracted to the use of an emitter having a wide forbidden band gap, more specifically to the use of an emitter formed of a semiconductor material whose forbidden band gap is wider than that of the material of the base. If the emitter is formed of such a semiconductor material, the emitter injection efficiency is not adversely affected even if the base doping concentration is increased, so that the base resistance can be reduced remarkably. This type of transistor, which is generally referred to as a heterojunction bipolar transistor (hereinafter abbreviated as HBT), is usually developed in the MBE or MOCVD process, using mainly semiconductor compounds obtained from the elements of groups III-V of the Periodic Table since such elements produces satisfactory heterojunctions and ensures good mobility of electrons. Like the case of an Si-based bipolar transistor, the widths of the emitter and the base-collector region of the HBT must be decreased, so as to achieve high operation. With the lithography technique presently available, however, the minimum stroke width and the allowance of mask alignment are substantially the same. Therefore, the self-alignment technique which needs no allowance of mask alignment is indispensable for achieving minute HBTs.

Among the presently known self-alignment techniques for HBTs, the technique used in the HBT manufacturing method using AlGaAs-GaAs material and proposed by Dumke et al. ("Solid State Electronics" Vo. 15 (1972), pp 1339-1343) may be convenient since it needs no allowance of mask alignment when emitter and base electrodes are formed.

This technique is still inappropriate to practical use, for the two reasons below.

(1) In the technique, a eutectic reaction between Au (of which to form an emitter electrode) and Ga occurs even at normal temperature. Therefore, when the AlGaAs layer is etched by use of an AuGe alloy mask, so as to form an emitter layer, abnormal etching may take place at the interface between AuGe alloy and the AlGaAs layer As a result, it is difficult to obtain an emitter layer having a desirable sectional shape.

(2) In order to produce a uniform undercut below the emitter electrode, an emitter stripe has to be arranged in the (1,1,0) direction. This arrangement is not desirable, in view of high integration of a transistor.

As mentioned above, various proposals have been made to obtain a semiconductor device which enables high-speed operation and utilizes the characteristics of a bipolar transistor (e.g., a high cut-off frequency characteristic). However, since the proposals are not satisfactory in their manufacturing processes, the semiconductor devices available at present do not fully satisfy the requirements in practical use.

SUMMARY OF THE INVENTION

The first object of the present invention is to provide a bipolar transistor enabling high-speed operation.

The second object of the present invention is to provide a semiconductor device wherein the emitter resistance is low.

The third object of the present invention is to provide a method for manufacturing a semiconductor device enabling high-speed operation.

To achieve the first two objects noted above, the present invention provides two types of semiconductor devices.

The first type of semiconductor device comprises:

a first semiconductor layer of a first conductivity type, the first semiconductor layer serving as a collector region;

a second semiconductor layer of a second conductivity type, which is formed on the first semiconductor layer and includes a base region and an external base region located around the base region;

a third semiconductor layer of the first conductivity type, which is formed on the second semiconductor layer and serves as an emitter region; layer and serving as an emitter electrode, the metal layer including a first metal layer portion which is substantially as wide as the base region located in an intrinsic transistor region, and a second metal layer portion which is formed on the first metal layer portion and is wider than the first metal portion;

a base electrode located on the external base region of the second semiconductor layer; and a collector electrode connected to the first semiconductor layer.

The second type of semiconductor device comprises:

a first semiconductor layer of a first conductivity type, the first semiconducting layer serving as an emitter region;

a second semiconductor layer of a second conductivity type, which is formed on the first semiconductor layer and includes a base region and an external base region located around the base region;

a third semiconductor layer of the first conductivity type, which is formed on the second semiconductor layer and serves as a collector region;

a metal layer formed on the third semiconductor layer and serving as a collector electrode, the metal layer including a first metal layer portion which is substantially as wide as the base region located in an intrinsic transistor region, and a second metal layer portion which is formed on the first metal layer portion and is wider than the first metal portion;

a base electrode located on the external base region of the second semiconductor layer; and an emitter electrode connected to the first semiconductor layer.

To achieve the third object noted above, the present invention provides a semiconductor device-manufacturing method, which comprises the steps of:

forming a first semiconductor layer of a first conductivity type on a semiconductor substrate, a second semiconductor layer of a second conductivity type on the first semiconductor layer, and a third semiconductor layer of the first conductivity type on the second semiconductor layer;

stacking first and second metal layers on the third semiconductor layer;

selectively etching the second metal layer, to thereby form a second metal layer pattern;

selectively side-etching the first metal layer to a predetermined extent, using the second metal layer pattern as a mask, to thereby form a first metal layer pattern which is more side-etched than the second metal layer pattern;

selectively etching the third semiconductor layer, using the first metal layer pattern as a mask, to thereby expose the second semiconductor layer; and forming a metal layer connected to the second semiconductor layer, by using the second metal layer pattern as a mask.

The metal used for forming the first metal layer of the present invention is not limited to any particular kind. However, it is desirable that the metal be chemically stable with reference to the third semiconductor layer when the ambient temperature and pressure are normal. Incidentally, the third semiconductor layer includes a grading layer for obtaining ohmic contact with the first metal layer and is formed of one of the following: molybdenum, titanium, tungsten, tantalum, chromium, silicide of any of these elements, and nitride of any of these elements.

The metal used for forming the second metal layer may be any kind, provided that it remains unetched during both the side-etching of the first metal layer and the etching of the third semiconductor layer.

The first through third semiconductor layers of the present invention may be formed of Si. Alternatively, they may be formed of a semiconductor compound which is obtained from the elements of groups III-V of the Periodic Table, such as GaAs. It is desirable that either the first or third semiconductor layer be formed of a material whose forbidden band gap is wider than that of the material of the second semiconductor layer, since this construction provides the HBT with high-speed operation.

In the present application, the term "intrinsic transistor region" is used to refer to a region which performs a transistor action.

In the semiconductor device of the present invention, the emitter electrode is constituted by a two-layer metal wherein the upper layer is wider than the lower layer. Due to this construction, the emitter resistance is reduced.

In the semiconductor device-manufacturing method of the present invention, the distance between the base electrode and the emitter (or the collector) region is determined by side-etching of the first metal layer that constitutes the emitter (or the collector) electrode. Unlike the case of the prior art, therefore, an emitter layer need not be arranged in a particular crystal orientation. As a result, a semiconductor device integrated with high density can be manufactured.

Moreover, the metal which contacts the emitter layer does not produce an interfacial reaction therewith. Therefore, the sectional shape of the emitter layer can be determined with accuracy.

BRIEF DESCRIPTION OF THE DRAWINGS

Other objects and advantages will be apparent from the following description taken in conjunction with the accompanying drawings, in which:

FIG. 1 is a plan view of an HBT according to one embodiment of the present invention;

FIG. 2 is a sectional view, taken along line II—II in FIG. 1;

FIGS. 3A-3F are views for illustrating the process in which the HBT according to the first embodiment is manufactured;

DETAILED DESCRIPTION OF THE PREFERRED EMBODIMENTS

Figure 3E:
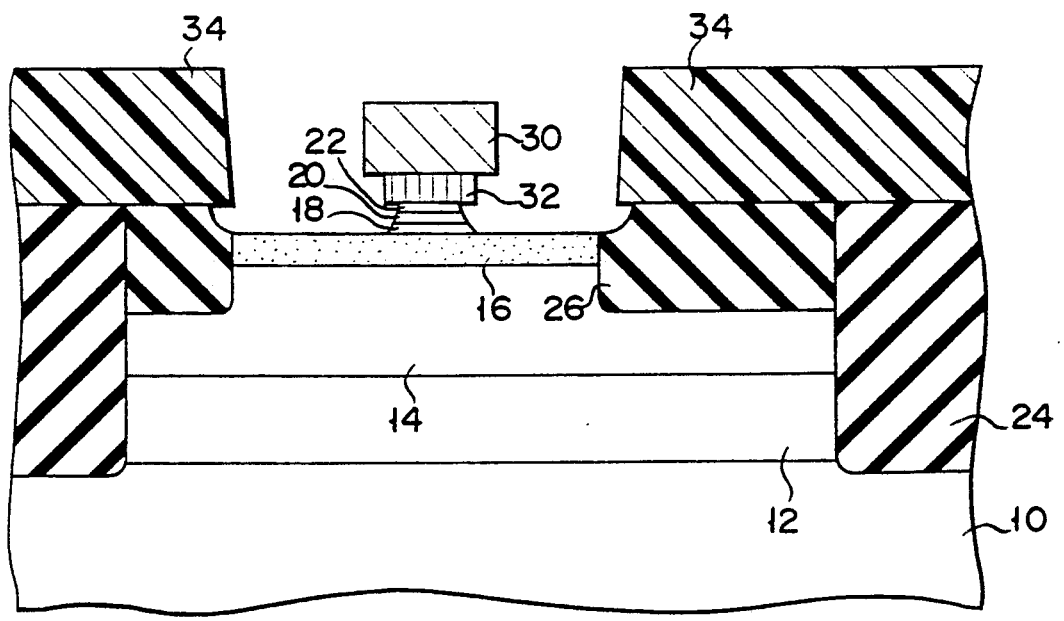

An HBT according to the first embodiment of the present invention (the HBT having a heterojunction between GaAs and AlGaAs) will now be described, with reference to FIGS. 1, 2 and 3A-3F.

First, how to manufacture the HBT illustrated in FIGS. 1 and 2 will be explained.

As is shown in FIG. 3A, semi-insulating semiconductor substrate 10 formed of GaAs is overlaid with the followings: n+-type GaAs collector layer 12 which is 0.5 μm thick and is buried in substrate 10; n-type GaAs collector layer 14 which is 0.5 μm thick and has a carrier concentration of $1 \times 10^{17}$ cm$^{-3}$; p-type GaAs base layer 16 which is 0.1 μm thick and has a carrier concentration of $3 \times 10^{19}$ cm$^{-3}$; n-type Al$_{0.25}$Ga$_{0.75}$As emitter layer 18 which is 0.1 μm thick and has a carrier concentration of $5 \times 10^{17}$ cm$^{-3}$; n-type AlGaInAs layer 20 which is 0.05 μm thick and has a carrier concentration of $1 \times 10^{19}$ cm$^{-3}$; and n-type Ga$_{0.5}$In$_{0.5}$As layer 22 which is 0.05 μm thick and has a carrier concentration of $3 \times 10^{19}$ cm$^{-3}$. These layers are successively grown on substrate 10 by the MBE process in the above-mentioned order. The composition of AlGaInAs layer 20 is Al$_{0.25}$Ga$_{0.75}$As at one surface, but the amounts of Al and Ga injected are gradually reduced and the amount of In injected is gradually increased such that the composition of layer 20 in the other surface will be In$_{0.5}$Ga$_{0.5}$As. Since the Schottky barrier of n-type In$_{0.5}$Ga$_{0.5}$As layer 22 is as low as 0.3 eV, layer 22 is permitted to have a satisfactory ohmic contact with a metal by increasing its carrier concentration to a sufficiently high value, such as that noted above. By increasing the carrier concentration of layer 22, therefore, an alloying reaction (i.e., eutectic reaction) between an AuGe metal and n-type GaAs layer need not be produced to achieve ohmic contact therebetween.

Next, highly resistive layer 24 for separating the elements from each other and highly resistive layer 26 for separating the base and collector from each other are formed by proton injection, as is shown in FIG. 3B.

Succeedingly, molybdenum layer 28 having a thickness of 0.1 μm is formed on the entire wafer by electron beam deposition, as is shown in FIG. 3C. Thereafter, emitter electrode pattern 30 of gold is formed on molybdenum layer 28 by a lift-off method.

As is shown in FIG. 3D, molybdenum layer 28 is selectively removed by reactive ion etching, using emitter electrode pattern 30 as a mask. A mixture gas including $CF_4$ and $O_2$ is used for the reactive ion etching. Molybdenum layer 28 is then side-etched to the extent of about 0.12 μm by performing over-etching for one minute or so, thereby forming molybdenum pattern 32.

After forming base electrode pattern 34 by use of photoresist, emitter layers 18, 20 and 22 are selectively etched by use of an etching solution including phosphoric acid, aqueous solution of hydrogen peroxide, and water. As a result of this selective etching, base layer 16 is exposed, as is shown in FIG. 3E. The composition of the etching solution is adjusted such that the volume percentages of phosphoric acid, aqueous solution of hydrogen peroxide and water are 3:1:50, for example. If the composition of the etching solution is adjusted in this way, molybdenum pattern 32 is hardly affected by the etching solution. In addition to this advantage, the etching solution determines the reaction rate with respect to GaAs, and the etching rate is not much varied due to the crystal planes of emitter layers 18, 20 and 22. Therefore, emitter layers 18, 20 and 22 can be etched substantially isotropic by using the etching solution.

Figure 3F:
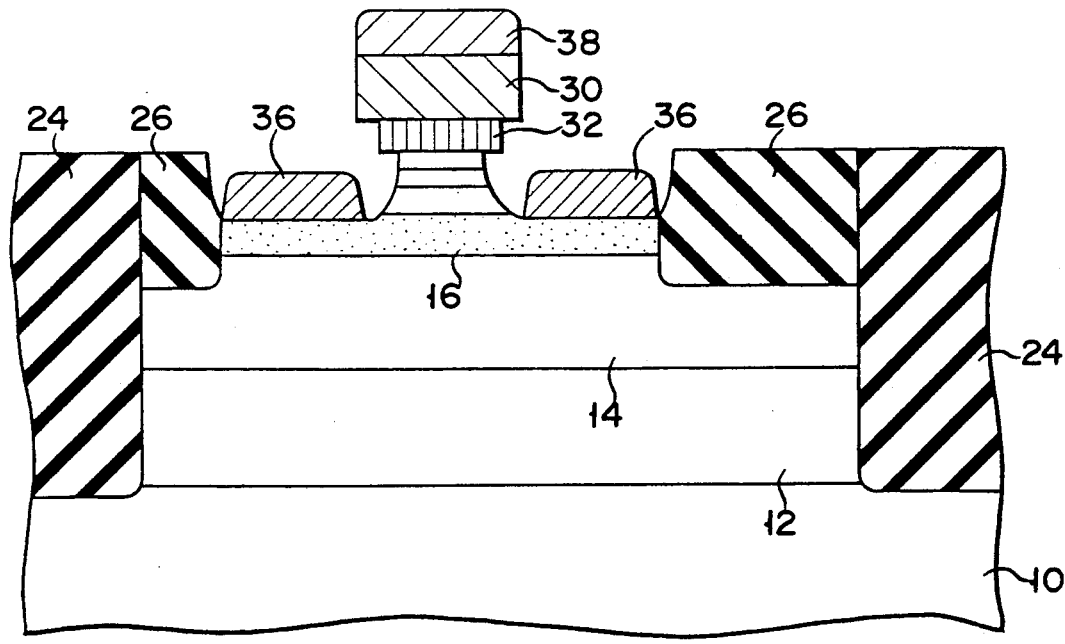
Figure 4:
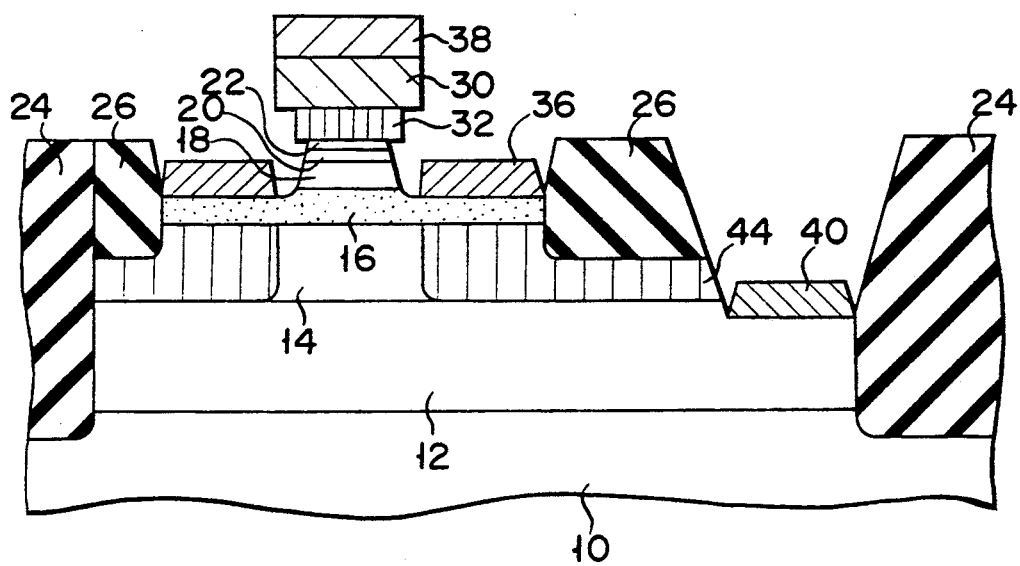
FIG. 4 is a sectional view of an HBT according to the second embodiment.

Next, base electrode 36 formed of chromium, platinum, and gold and having a thickness of 0.5 μm, and uppermost layer 38 of the emitter electrode are formed by deposition. After dissolving resist 34, the construction illustrated in FIG. 3F is obtained by a lift-off method.

Finally, collector layer 12 buried in substrate 10 is exposed by mesa-etching, thereby forming collector electrode 40 formed of AuGe, Ni, and Au. As a result, the HBT illustrated in FIGS. 1 and 2 is obtained.

The emitter electrode of the resultant HBT is formed of molybdenum. Since molybdenum does not react with InGaAs at a temperature lower than 350° C., it does not produce any chemical compound, with the result that a satisfactorily stable interface is obtained between molybdenum and InGaAs. In the prior art, abnormal etching is likely to occur at the interface between AuGe and GaAs when the emitter layer is etched, but the present embodiment is free from this problem. If an AuGe-based electrode is employed, as in the prior art, it will temporarily have a liquid phase and become runny during the alloying process. As a result, the electrode will begin to spread out during the alloying process, thus adversely affecting the final shape of the electrode. The present embodiment is also free from this problem.

In the embodiment, moreover, base electrode 36 and emitter layers 18, 20, and 22 can be separated from one another, by performing side-etching of molybdenum layer 28. Since the separation between the base electrode and the emitter is not dependent on the anisotropy of etching, the direction in which an emitter stripe is arranged can be determined freely.

As can be understood from the above, emitter region 42 and base electrode 36 can be positioned with reference to emitter electrode 30 in a self-alignment fashion. Therefore, a minute semiconductor element can be produced easily. In the case where both the width of emitter electrode 30 and the allowance of alignment were set to be 1 μm in the embodiment, the resultant HBT was very minute; the width of emitter region 42 was 0.76 μm and the width of the junction between the base and collector was 3 μm.

An HBT according to the second embodiment of the present invention will now be described.

The HBT of the second embodiment is featured in that the capacity of the base-collector region is reduced. The process for manufacturing the HBT of the second embodiment is similar to the above-mentioned process, except for the steps explained with reference to FIG. 3D. Specifically, n-type GaAs collector layer 14 is injected with protons, by use of both emitter electrode pattern 30 and molybdenum pattern 32 as a mask, in such a manner as to achieve an energy of 80 KeV and a dose amount of $1 \times 10^{13}$ cm$^{-2}$. As a result of this proton injection, GaAs layer 44 located under base electrode 36 becomes highly resistive. In the case of the HBT of the second embodiment, the capacity of the base-collector region is about ½ of the corresponding capacity of the HBT of the first embodiment.

In the above embodiments, the first metal layer (which constitutes the emitter electrode) is formed of molybdenum. However, the material of the first metal layer is not limited to molybdenum; for example, tantalum, tungsten, titanium, or some other metal may be used in lieu of molybdenum. In addition, either silicide or nitride of each of the metals may be used, if desired. As for the second metal layer (which constitutes the emitter electrode), it is only required that its material be chemically stable with reference to acid. Therefore, not only gold but also platinum, chromium, nickel, or some other metal may be used as the material of the second metal layer.

Figure 5:
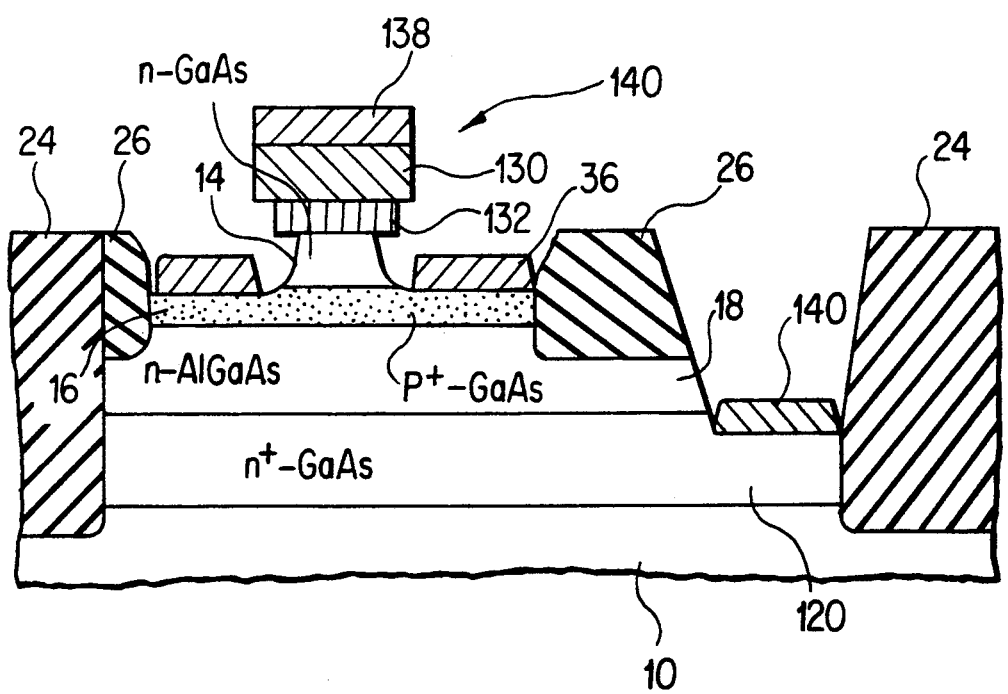
FIG. 5 is a sectional view of an HTB according to a third embodiment of the present invention.

Referring to FIG. 5, an HTB according to the third embodiment of the present invention will now be described.

This HTB is of a collector top type. Semi-insulating semiconductor substrate 10 is overlaid with an n+-type GaAs emitter layer 120, an n-type AlGaAs emitter layer 18, a p-type GaAs base layer 16, and an n-type GaAs collector layer 14. An emitter electrode 140 is in contact with the emitter layer 120, a base electrode 36 with the base layer 16, and a collector electrode 140 with the collector layer 14. The collector electrode 140 comprises a first metal portion 132, a second metal portion 130, and a third metal portion 138. The first metal portion corresponds to the portion 32, the second metal portion to the portion 30, and the third metal portion to the portion 38 in the first embodiment. The remaining structure is same as the first embodiment, then the same reference numerals are used and detailed explanation is omitted.

What is claimed is:

1. A method for manufacturing a bipolar transistor having an external base region, said method comprising the steps of:
    forming a first semiconductor layer of a first conductivity type on a semiconductor substrate, a second semiconductor layer of a second conductivity type on the first semiconductor layer, and a third semiconductor layer of the first conductivity type on the second semiconductor layer;

stacking first and second metal layers over the third semiconductor layer;

selectively etching the second metal layer, to thereby form a second metal layer pattern;

selectively side-etching the first metal layer to a predetermined extent, using the second metal layer pattern as a mask, to thereby form a first metal layer pattern which is more side-etched than the second metal layer pattern;

selectively etching the third semiconductor layer, using the first metal layer pattern as a mask, to thereby expose the second semiconductor layer; and forming a metal layer connected to the second semiconductor layer, by using the second metal layer pattern as a mask.

2. A method according to claim 1, wherein the third semiconductor layer is etched isotropically.

3. A method according to claim 1, further comprising the step of injecting ions to part of the first semiconductor layer, by using both the first and second metal layer patterns as a mask, whereby the part is made to have high resistance.

* * * * *